United States Patent
Makabe et al.

(10) Patent No.: US 8,247,796 B2
(45) Date of Patent: Aug. 21, 2012

(54) SEMICONDUCTOR DEVICE

(75) Inventors: Isao Makabe, Kanagawa (JP); Ken Nakata, Kanagawa (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 169 days.

(21) Appl. No.: 12/731,728

(22) Filed: Mar. 25, 2010

(65) Prior Publication Data

US 2010/0243989 A1 Sep. 30, 2010

(30) Foreign Application Priority Data

Mar. 26, 2009 (JP) ................. 2009-077541

(51) Int. Cl.
*H01L 29/06* (2006.01)
(52) U.S. Cl. ............... 257/20; 257/76; 257/77; 257/507; 257/E29.246
(58) Field of Classification Search ............ 257/76, 257/77, 20, 507, E29.246
See application file for complete search history.

(56) References Cited

U.S. PATENT DOCUMENTS

| 7,518,154 | B2 | 4/2009 | Otsuka et al. |
| 2005/0110043 | A1 | 5/2005 | Otsuka et al. |
| 2008/0242060 | A1* | 10/2008 | Kosaka et al. ............... 438/478 |
| 2008/0274574 | A1* | 11/2008 | Yun ............................ 438/47 |
| 2011/0001127 | A1* | 1/2011 | Sakamoto et al. ............ 257/22 |

FOREIGN PATENT DOCUMENTS

| JP | 2005-15889 A | 6/2005 |
| JP | 2007-067077 A | 3/2007 |

* cited by examiner

*Primary Examiner* — Tan N Tran
(74) *Attorney, Agent, or Firm* — Westerman, Hattori, Daniels & Adrian, LLP

(57) ABSTRACT

A semiconductor device includes a substrate, a superlattice buffer layer that is formed on the substrate and is composed of first $Al_xGa_{1-x}N$ layers and second $Al_xGa_{1-x}N$ layers having an Al composition greater than that of the first $Al_xGa_{1-x}N$ layers, the first and second $Al_xGa_{1-x}N$ layers being alternately stacked one by one, both the Al compositions of the first and second $Al_xGa_{1-x}N$ layers being greater than 0.3, and a difference in Al composition between the first and second $Al_xGa_{1-x}N$ layers being greater than 0 and smaller than 0.6.

9 Claims, 6 Drawing Sheets

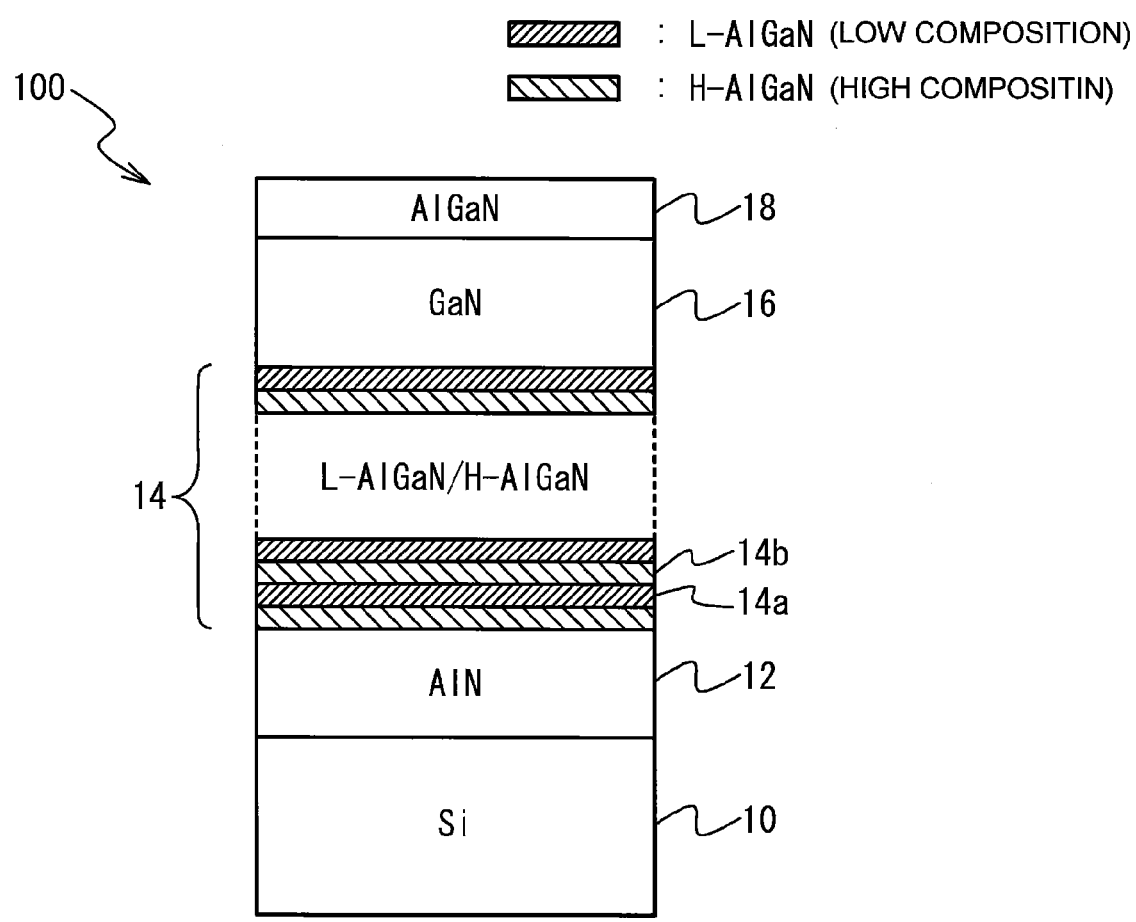

SEMICONDUCTOR DEVICE

CROSS-REFERENCE TO RELATED APPLICATION

This application is based upon and claims the benefit of priority of the prior Japanese Patent Application No. 2009-077541, filed on Mar. 26, 2009, the entire contents of which are incorporated herein by reference.

BACKGROUND (i) Technical Field

The present invention relates to a semiconductor device, and more particularly, to a semiconductor device having a GaN-based semiconductor layer.

(ii) Related Art

A semiconductor device using a compound semiconductor layer containing Ga (gallium) and N (nitrogen) (GaN-based semiconductor) has attracted attention as an amplifying device capable of operating at high frequencies and outputting high power. The GaN-based semiconductor is a semiconductor that contains gallium nitride (GaN), and is, for example, GaN, AlGaN that is a mixed crystal of GaN and aluminum nitride (AlN), InGaN that is a mixed crystal of GaN and indium nitride (InN), and AlInGaN that is a mixed crystal of GaN, AlN and InN.

In a case where a GaN-based semiconductor layer is grown on a silicon substrate, an underlying buffer layer is preferably formed in order to reduce stress resulting from the difference in crystal structure between the silicon substrate and the GaN-based semiconductor layer. The buffer layer may have a multilayer structure in which an AlN layer and a GaN layer are alternately stacked (see Japanese Patent Application Publication No. 2005-158889). There is known another buffer layer having a first $Al_xGa_{1-x}N$ layer having an aluminum composition x as low as 0.1 and a second $Al_xGa_{1-x}N$ layer having an aluminum composition x as high as 0.75, which different layers are alternately stacked (see Japanese Patent Application Publication No. 2007-067077). In the following, the aluminum composition x is the value of x in $Al_xGa_{1-x}N$.

SUMMARY OF THE INVENTION

It is an object of the present invention to provide a semiconductor device having suppressed leakage current through a buffer layer.

According to an aspect of the present invention, there is provided a semiconductor device including: a substrate; a superlattice buffer layer that is formed on the substrate and is composed of first AlxGa1-xN layers and second AlxGa1-xN layers having an Al composition greater than that of the first AlxGa1-xN layers, the first and second AlxGa1-xN layers being alternately stacked one by one, both the Al compositions of the first and second AlxGa1-xN layers being greater than 0.3, and a difference in Al composition between the first and second AlxGa1-xN layers being greater than 0 and smaller than 0.6.

BRIEF DESCRIPTION OF THE DRAWINGS

FIG. 1 is a cross-sectional view of a semiconductor device in accordance with a first embodiment;

DETAILED DESCRIPTION

Figure 2A:
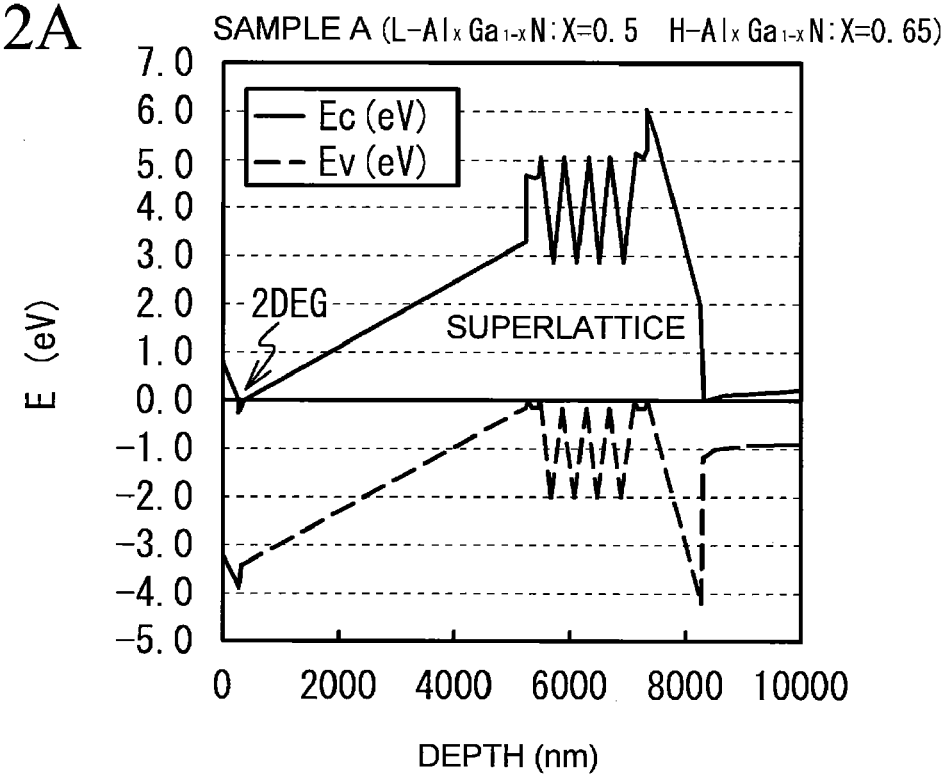
FIGS. 2A and 2B are graphs that illustrate band structures of semiconductor devices in accordance with the first embodiment and a comparative example.

In the buffer layer composed of two different AlGaN layers that are alternately stacked and have different aluminum compositions, leakage current through the buffer layer may take place and may affect the characteristics of the semiconductor device. In a case where a field effect transistor is formed in the GaN-based semiconductor layer grown on the buffer layer having the above layer structure, the leakage current through the buffer layer degrades the transistor characteristics. For example, increased leakage between the source and drain of the transistor occur.

According to an aspect of an embodiment, the leakage current through the buffer layer can be suppressed.

A description will now be given of embodiments of the present invention with reference to the accompanying drawings.

First Embodiment

FIG. 1 is a cross-sectional view of a semiconductor device 100 in accordance with a first embodiment. A buffer layer 12 formed by an AlN layer is grown on a silicon substrate 10. The AlN buffer layer 12 may be replaced with a layer made of a material other than AlN as long as the buffer layer 12 meets a condition of $Al_xIn_yGa_{1-x-y}N$ (x+y≦1). The buffer layer 12 may be composed of multiple layers that meet the above condition. A superlattice buffer layer 14 is formed on the upper surface of the AlN layer 12. The superlattice buffer layer 14 is composed of an L-AlGaN layer 14a (first AlGaN layer) having a low Al composition and a H-AlGaN layer 14b (second AlGaN layer) having a high Al composition, which layers are alternately stacked multiple times.

A GaN layer 16 is formed on the upper surface of the superlattice buffer layer 14. There is a great difference in the crystal structure between the AlN layer 12 and the GaN layer 16, as compared to the difference between the silicon substrate 10 and the AlN layer 12. The superlattice buffer layer 14 functions to relax stress between the AlN layer 12 and the GaN layer 16. An AlGaN layer 18 is formed on the upper surface of the GaN layer 16. The layer formed on the GaN layer 16 is required to be a GaN-based semiconductor layer, and may be a GaN-based semiconductor layer other than the AlGaN layer 18. Although not illustrated in FIG. 1, electrodes may be provided on the AlGaN layer 18.

The semiconductor device 100 illustrated in FIG. 1 may have leakage current that flows between electrodes through the superlattice buffer layer 14. According to an aspect of the present embodiment, the semiconductor device 100 is configured to suppress the leakage current by adjusting the Al compositions of the L-AlGaN layers 14a and the H-AlGaN layers 14b.

Figure 2B:
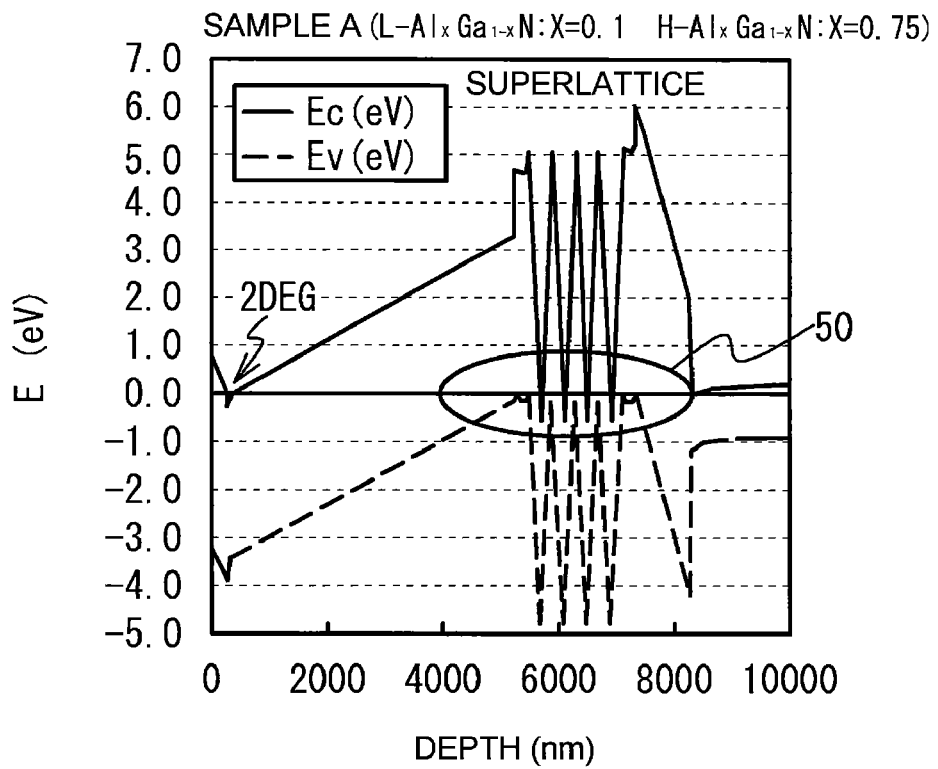

FIGS. 2A and 2B illustrate band structures of the semiconductor devices 100 in accordance with the present embodiment and the comparative example, respectively. More particularly, FIG. 2A illustrates the band structure of a sample (sample A) of the first embodiment, and FIG. 2B illustrates that of a sample (sample B) of the comparative example. The samples A and B have mutually different Al compositions of the L-AlGaN layers 14a and the H-AlGaN layers 14b, and other identical conditions.

The AlGaN layer 18 has an Al composition of 20%. Both the samples A and B employ the same silicon substrate 10. Each layer has the following thickness.

AlN layer 12: 100 nm
L-AlGaN layers 14a: 25 nm
H-AlGaN layers 14b: 25 nm
Superlattice buffer layer 14: 500 nm (layer 14 is composed of 10 L-AlGaN layers 14a and 10 H-AlGaN layers 14b)
GaN layer 16: 500 nm
AlGaN layer 18: 30 nm The Al compositions X of AlxGa1-xN of the superlattice buffer layers 14 in the samples A and B are as follows:
(Al Composition of Sample A)
L-AlGaN layers 14a: 0.5
H-AlGaN layers 14b: 0.65
(Al Composition of Sample B)
L-AlGaN layers 14a: 0.1
H-AlGaN layers 14b: 0.75

A piezoelectric charge that depends on the difference in Al composition is generated at each interface between the adjacent layers. In each of FIGS. 2A and 2B, the horizontal axis denotes the depth (nm) of the semiconductor device 100 from the surface thereof, and the vertical axis denotes the potential E (eV). Further, a solid line Ec indicates the potential of the conduction band, and a broken line Ev indicates the potential of the valence band. A potential E of 0 eV is the Fermi level. A symbol 2DEG indicates the position of the two-dimensional electron gas, in which Ec<0. A wavy portion of each graph corresponds to the superlattice buffer layer 14 including the L-AlGaN layers 14a and the H-AlGaN layers 14b.

The difference in Al composition between the L-AlGaN layers 14a and the H-AlGaN layers 14b of the sample A is 0.15, which is smaller than 0.65 of a difference in Al composition of the sample B. Each Al composition of the sample B is equal to that employed in the AlGaN buffer layer described in Japanese Patent Application Publication No. 2007-067077 described previously.

In FIGS. 2A and 2B, the band structures in the superlattice AlGaN buffer layers of the samples A and B differ from each other in that the sample B has deep potential wells in a region surrounded by an ellipse 50 in FIG. 2B, as compared to the sample A. In the region of the ellipse 50, the potential of the conduction band Ec is lower than the Fermi level (E<0) in several depth positions. Thus, leakage current tends to occur.

In contrast, the sample A has shallow potential wells in the superlattice buffer layer 14, and the potential of the conduction band Ec is higher than the Fermi level (E>0). This band structure prevents electrons from moving to the superlattice buffer layer 14 and suppresses the leakage current. The depths of the potential wells depend on the difference in Al composition between the L-AlGaN layers 14a and the H-AlGaN layers 14b. It can be seen from the above, the leakage current can be suppressed by adjusting the Al compositions so that the difference in Al composition between the two different AlGaN layers in the superlattice buffer layer 14 is to be small.

Figure 3:
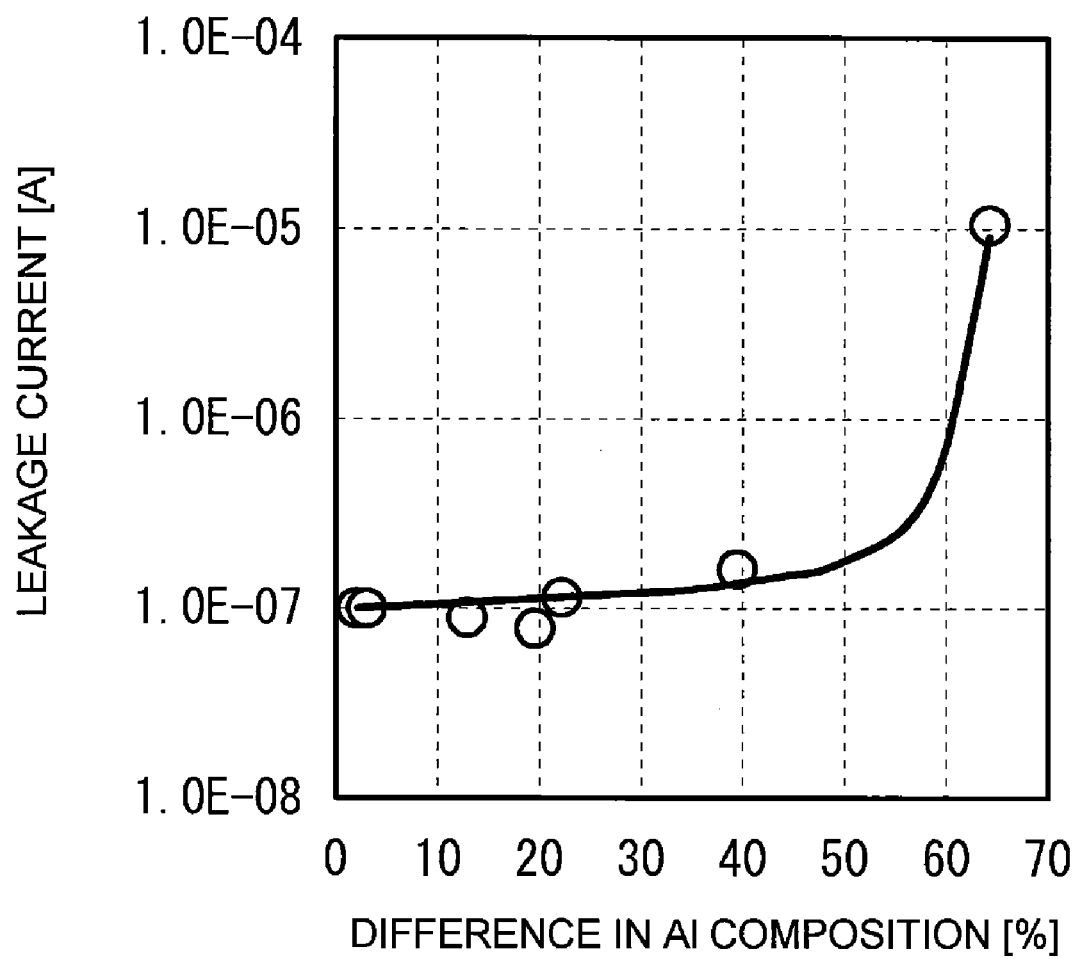
FIG. 3 is a graph that illustrates a relation between a difference in Al composition in a superlattice AlGaN buffer layer and leakage current.
Figure 4:
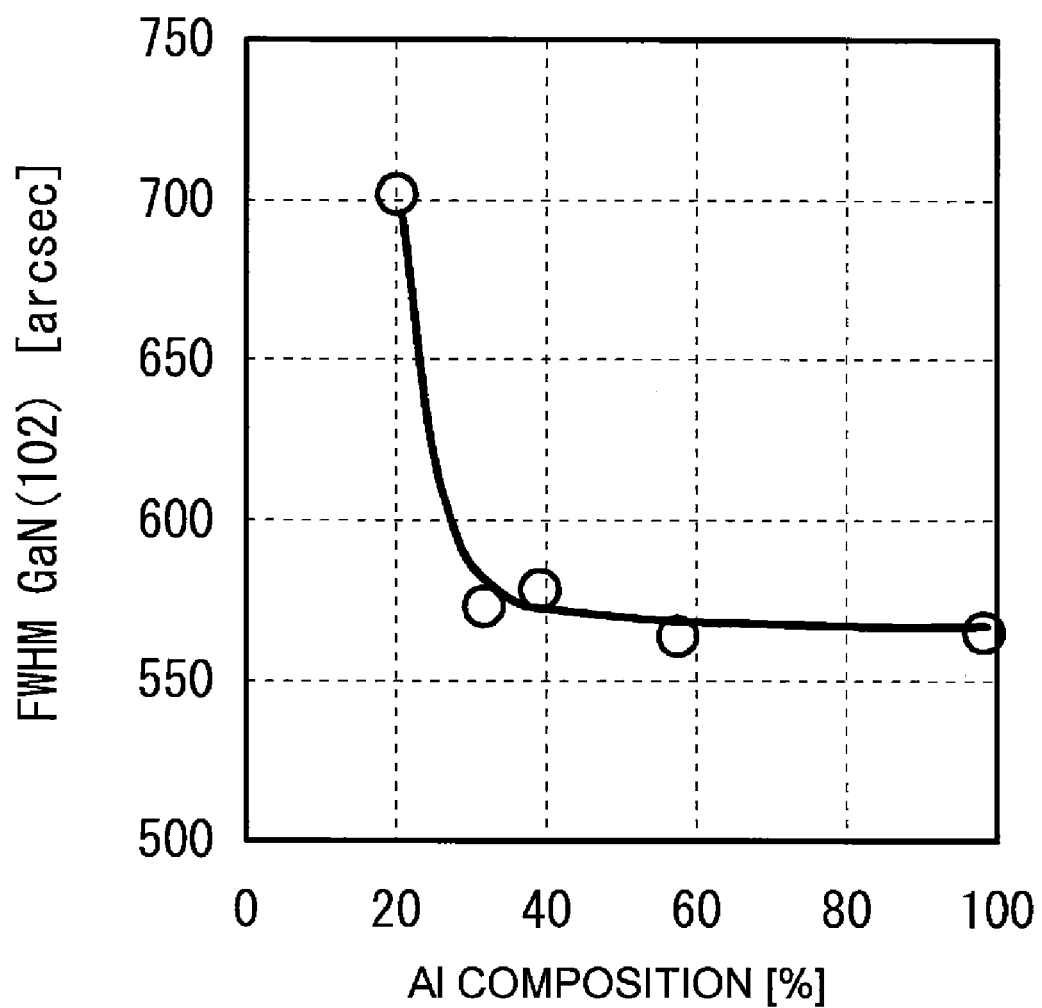
FIG. 4 is a graph that illustrates a relation between the Al composition in a superlattice AlGaN buffer layer and the crystal quality of a GaN layer.

A description will now be given of an appropriate range of the Al composition in the superlattice buffer layer 14. The inventors actually fabricated the semiconductor device 100 illustrated in FIG. 1, and measured the leakage current that flows through the superlattice buffer layer 14 by changing the Al compositions of the L-AlGaN layers 14a and the H-AlGaN layers 14b. FIG. 3 is a graph illustrating a result of this measurement, which will be described later. Further, the inventors measured a relation between the Al composition in the superlattice buffer layer 14 and the crystal quality of the GaN layer 16 formed thereon. FIG. 4 is a graph illustrating a result of this measurement, which will be described later.

The semiconductor devices 100 used in the measurements were fabricated through the following steps by MOCVD (MetalOrganic Chemical Vapor Deposition). First, a surface oxide film on the silicon substrate 10 is removed by hydrofluoric acid (HF). Next, the silicon substrate 10 is placed in a MOCVD apparatus. Then, the silicon substrate 10 is sprayed with a hydrogen carrier gas, which may be replaced by a nitrogen gas or a mixed gas of hydrogen and nitrogen. Then, the temperature is raised to 1050° C. for thermal cleaning. Thereafter, the MOCVD apparatus is supplied with trimethylaluminum (TMA) and ammonia ($NH_3$), and an aluminum nitride (AlN) layer is grown by a thickness of 250 nm.

Next, aluminum gallium nitride having an Al composition of 0.4 $Al_{0.6}Ga_{0.4}N$ and aluminum gallium nitride having an Al composition of 0.6 $Al_{0.6}Ga_{0.4}N$ are alternately formed on the AlN layer at a growth temperature of 1100° C. until the total thickness becomes equal to 250 nm. Then, the growth temperature is raised to 1150° C. and the MOCVD apparatus is supplied with trimethylgallium (TMG) and $NH_3$ to grow gallium nitride by 1000 nm. After that, the growth temperature is lowered to 1050° C., and aluminum gallium nitride having an Al composition of 0.25 ($Al_{0.25}Ga_{0.75}N$) is grown by 30 nm.

FIG. 3 illustrates the relation between the difference in Al composition between the L-AlGaN layers 14a and the H-AlGaN layers 14b of the superlattice buffer layer 14 of the semiconductor device 100 and the leakage current between electrodes through the superlattice buffer layer 14. The leakage current is measured by using a structure so that two electrodes are formed on the AlGaN layer 18 so as to be spaced apart from each other and are separated from each other by a separate groove that reaches the GaN layer 16. The horizontal axis of the graph denotes the difference (%) in Al composition, and the vertical axis denotes the magnitude of leakage current (A). As illustrated in FIG. 3, as the difference in Al composition increases, the leakage current increases. This is because the charge is stored in the deep potential wells and current tends to flow, as has been described with reference to FIG. 2B.

As illustrated in FIG. 3, the leakage current increases abruptly when the difference in Al composition is about 0.6. It is thus preferable that the difference in Al composition x between the L-AlGaN layers 14a and the H-AlGaN layers 14b is set smaller than 0.6 in order to considerably suppress the leakage current. Further, the graph of FIG. 3 shows that the difference in Al composition is preferably smaller than 0.4 in terms of suppression of leakage current, and is more preferably smaller than 0.2. Much more preferably, the difference in Al composition is smaller than 0.1.

In a case where the superlattice buffer layer 14 has a poor crystal quality, increased leakage current may flow in a semiconductor layer (layer 16 or 18) grown thereon since the semiconductor takes over the poor crystal quality. This means that the effect of reducing the leakage current attempted by setting the difference in Al composition between the L-AlGaN layers 14a and the H-AlGaN layers 14b lower than 0.6 is degraded. According to an aspect of an embodiment, the appropriate range of Al composition is determined taking the above into account.

FIG. 4 is a graph that illustrates the relation between the Al composition in the superlattice buffer layer 14 of the semiconductor device and the crystal quality of the GaN layer 16 formed thereon. The horizontal axis of the graph denotes the Al composition, and the vertical axis denotes the full width at half maximum (FWHM) of rocking curves for the surface of the GaN layer 16. The FWHM is an index that indicates the degree of crystal quality of the GaN layer 16. As the FWHM indicates a greater value, the crystal quality becomes worse and an increasing number of defects such as transitions exists. In contrast, as the FWHM indicates a smaller value, the crystal quality becomes better. As illustrated in FIG. 4, as the Al composition becomes greater, the FWHM indicates a smaller value and the crystal quality becomes better. The measurement of FWHM was carried out before the AlGaN layer 18 was formed on the GaN layer 16.

As illustrated in FIG. 4, the value of FWHM decreases abruptly when Al composition in $Al_xGA_{1-x}N$ is about 0.3. It is thus important to set the Al composition x of the AlGaN layer greater than 0.3 in order to improve the crystal quality of the superlattice buffer layer 14 and realize satisfactory leakage reduction. Further, it is preferable that the Al composition x of the AlGaN layer is greater than 0.4 because the value of FWHM gradually decreases even over 0.3. More preferably, the Al composition x is greater than 0.5. Much more preferably, the Al composition x is greater than 0.6.

It can be seen from FIGS. 3 and 4, it is important that the Al compositions of the L-AlGaN layers 14a and the H=AlGaN layers 14b in the superlattice buffer layer 14 of the semiconductor device 100 meet the following two conditions. The first condition is that the difference in Al composition x ($Al_xGa_{1-x}N$) between the L-AlGaN layers 14a and the H-AlGaN layers 14b is greater than 0 and is smaller than 0.6. The second condition is that the Al compositions of both the L-AlGaN layers 14a and the H-AlGaN layers 14b are greater than 0.3.

A typical example that satisfies the above conditions is such that the Al composition x of the L-AlGaN layers 14a is between 0.4 and 0.6 and that of the H-AlGaN layers 14b is between 0.5 and 0.7.

The semiconductor device 100 of the present embodiment meets the first and second conditions and suppresses the leakage current considerably. Generally, it is considered that, in a case where an AlGaN buffer layer having different Al compositions is used, the effect of stress reduction is not great if the difference in Al composition is small, and the crystal quality of the GaN layer 16 is degraded. However, the semiconductor devices 100 actually fabricated has good crystal quality.

It is not essential that the L-AlGaN layers 14a and the H-AlGaN layers 14b in the superlattice buffer layer 14 have an equal thickness. In the conventional AlGaN layer having a great difference in Al composition, the H-AlGaN layers are required to be thinner than the L-AlGaN layers. In contrast, the AlGaN layer of the semiconductor device having a small difference in Al composition in accordance with the present embodiment may be designed to have a small difference in thickness between the L-AlGaN layers 14a and the H-AlGaN layers 14b. As the difference in thickness between the two different AlGaN layers becomes small, the effect of stress reduction becomes greater. Thus, it is preferable to have a small difference in thickness between the two different AlGaN layers. Particularly, the effect of stress reduction is enhanced by designing the L-AlGaN layers 14a and the H-AlGaN layers 14b to have a substantially equal thickness. It is to be noted that the substantially equal thickness means there is no difference in thickness except a difference within the margin of error.

In the superlattice buffer layer 14, the L-AlGaN layers 14a and the H-AlGaN layers 14b are alternately stacked one by one. An arbitrary number of layers to be stacked may be selected. However, the superlattice buffer layer 14 employed in the present embodiment has the effect of stress reduction greater than that of the conventional art. Thus, the whole semiconductor device 100 can be thinned by using a smaller number of L-AlGaN layers and a small number of H-AlGaN layers. For example, the semiconductor device 100 having a considerably thinned structure may be realized by using 10 L-AlGaN layers or less and 10 H-AlGaN layers or less.

The above-described method for fabricating the semiconductor device 100 is an exemplary method, and the thickness of each layer and the Al composition in each AlGaN layer may be changed. The temperatures in the processes may be changed. The substrate is not limited to the silicon substrate but may be a silicon carbide (SiC) substrate or a sapphire substrate.

Second Embodiment

Figure 5A:
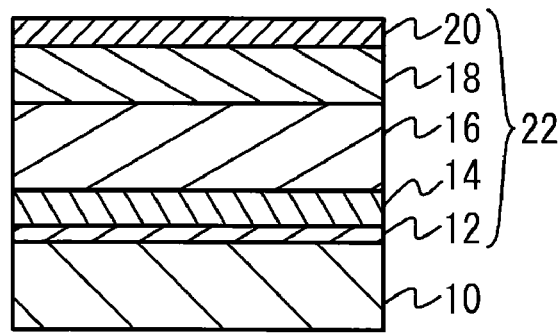
FIGS. 5A through 5F are cross-sectional views that illustrate an FET in accordance with a second embodiment.

A second embodiment is a field effect transistor (FET) having the superlattice buffer layer 14 employed in the above-described first embodiment. FIGS. 5A through 5F are cross-sectional views that illustrate a method for fabricating a semiconductor device 200 in accordance with the second embodiment. Referring to FIG. 5A, the AlN layer 12 and the superlattice buffer layer 14 are sequentially formed on the silicon substrate 10 by MOCVD. Next, the GaN electron travel layer 16 having a thickness of 1000 nm is formed on the superlattice buffer layer 14. Then, the AlGaN electron supply layer 18 having a thickness of 30 nm is formed on the GaN electron travel layer 16. The Al composition of the AlGaN electron supply layer 18 is 20%. The GaN cap layer 20 having a thickness of 3 nm is formed on the AlGaN electron supply layer 18. Through the above processes, the present method forms, on the substrate 10, a GaN-based semiconductor layer 22 composed of the AlN layer 12, the superlattice buffer layer 14, the GaN electron travel layer 16, the AlGaN electron supply layer 18, and the GaN cap layer 20.

Figure 5B:
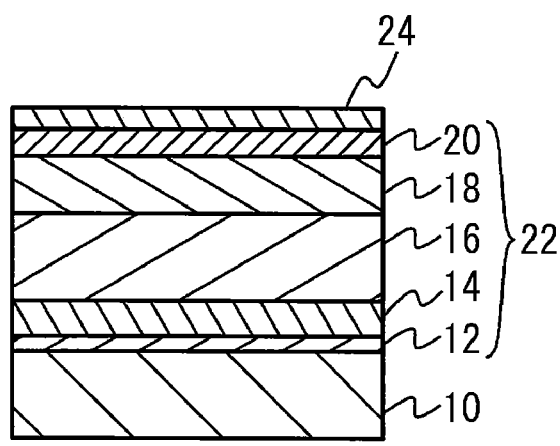
Figure 5C:
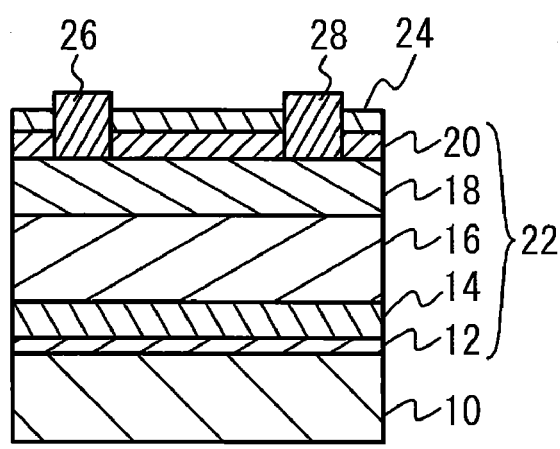

Referring to FIG. 5B, a gate insulating film 24 having a thickness of 40 nm is formed on the GaN-based semiconductor layer 22. The film 24 may be an $Al_2O_3$ film, and may be formed by ALD (Atomic Layer Deposition) with TMA and $O_3$. After that, the wafer is annealed in a nitrogen gas atmosphere at 700° C. for 5 minutes. Then, insulation for isolating transistors from each other (not illustrated) is implemented by etching with a $BCl_3/Cl_2$ gas, and openings are formed in the gate insulating film 24. Then, as illustrated in FIG. 5C, a source electrode 26 and a drain electrode 28, which electrodes may be formed by Ni/Au, are formed in the openings.

Figure 5D:
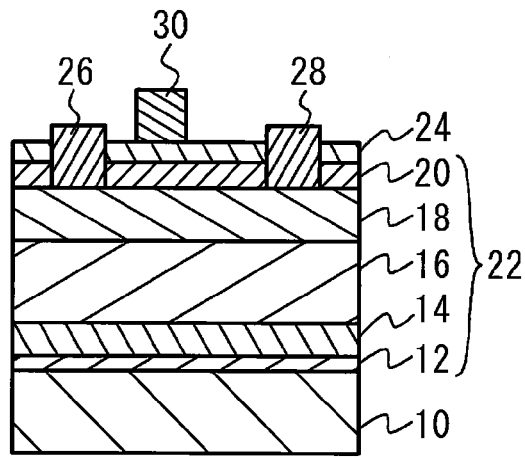
Figure 5E:
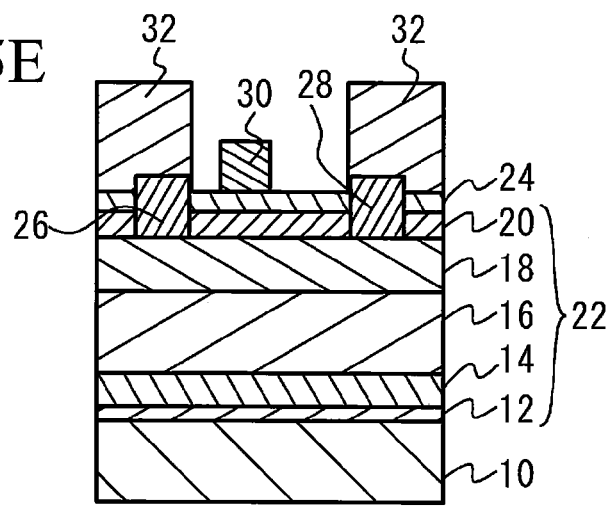
Figure 5F:
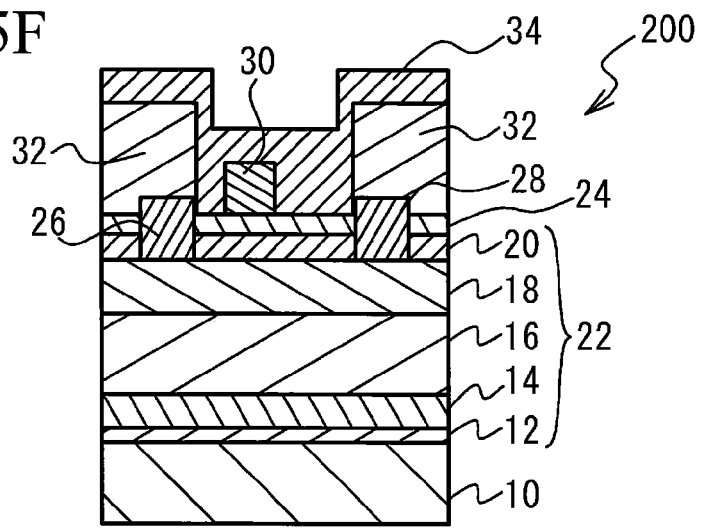

Referring to FIG. 5D, a gate electrode 30, which may be formed by Ni/Au, is formed on the gate insulating film 24. Then, as illustrated in FIG. 5E, interconnections or wiring layers 32 are formed so as to be connected to the source electrode 26 and the drain electrode 28. Finally, as illustrated in FIG. 5F, a protection film 34 is formed so as to cover the gate electrode 30 and the wiring layers 32. Through the above processes, the semiconductor device 200 is fabricated.

The semiconductor device 200 of the second embodiment is an FET configured so that the gate electrode 30 is formed on the AlGaN electron supply layer 18 (which is a GaN-based semiconductor layer) and the source electrode 26 and the drain electrode 28 (which are ohmic electrodes) are formed so as to sandwich in the gate electrode 30. Since the semiconductor device 200 employs the superlattice buffer layer 14 as in the case of the first embodiment, it is possible to suppress leakage current between the source electrode 26, the drain electrode 28 and the gate electrode 30.

The gate insulating film 24 is not limited to the aluminum oxide film but may have a multilayer structure composed of multiple layers including an aluminum oxide film. In the multilayer structure, it is preferable that the film of the gate insulating film that contacts the GaN-based semiconductor layer is the aluminum oxide film. It is thus possible to reduce the interface state density and realize the good gate insulating film. Exemplary films that are stacked on the aluminum oxide film may be made of hafnium oxide, zirconium oxide, titanium oxide, tantalum oxide, silicon oxide or silicon nitride. A film having a mixture of any of the above insulating materials may be used.

The first and second embodiments have the GaN-based semiconductor layers that are formed by MOCVD. The gate insulating film may be formed by ALD by switching the source gas in the MOCVD apparatus to TMA and $O_3$ (or $O_2$) after the GaN-based semiconductor layer is formed. This results in the good gate insulating film.

The present invention is not limited to the specifically described embodiments and variations but may include other embodiments and variations without departing from the scope of the present invention.

What is claimed is:

1. A semiconductor device comprising:
   a substrate;
   an AlN layer being provided on the substrate;
   a superlattice buffer layer that is formed directly on the AlN layer on the substrate and is composed of first $Al_xGa_{1-x}N$ layers and second $Al_xGa_{1-x}N$ layers having an Al composition greater than that of the first $Al_xGa_{1-x}N$ layers, the first and second $Al_xGa_{1-x}N$ layers being alternately stacked one by one,
   both the Al compositions of the first and second $Al_xGa_{1-x}N$ layers being greater than 0.3,
   a difference in Al composition between the first and second $Al_xGa_{1-x}N$ layers being greater than 0 and smaller than 0.6, and
   a GaN-based semiconductor provided on the superlattice buffer layer, wherein the GaN-based semiconductor layer has a field effect transistor.

2. The semiconductor device according to claim 1, wherein the first and second $Al_xGa_{1-x}N$ layers have a substantially identical thickness.

3. The semiconductor device according to claim 1, wherein the number of the first AlGaN layers is equal to or smaller than 10, and the number of the second AlGaN layers is equal to or smaller than 10.

4. The semiconductor device according to claim 1, wherein the superlattice buffer layer is a layer formed by MOCVD.

5. The semiconductor device according to claim 1, wherein the substrate is one of a silicon substrate, a silicon carbide and a sapphire substrate.

6. The semiconductor device according to claim 1, wherein a difference in Al composition between the first and second $Al_xGa_{1-x}N$ layers is smaller than 0.4.

7. The semiconductor device according to claim 1, wherein a difference in Al composition between the first and second $Al_xGa_{1-x}N$ layers is smaller than 0.2.

8. The semiconductor device according to claim 1, wherein a difference in Al composition between the first and second $Al_xGa_{1-x}N$ layers is smaller than 0.1.

9. The semiconductor device according to claim 1, wherein the Al composition of the first $Al_xGa_{1-x}N$ layers is 0.4 to 0.6 and that of the second $Al_xGa_{1-x}N$ layers is 0.5 to 0.7.

* * * * *